(12) United States Patent
Zhu et al.

(10) Patent No.: US 11,935,751 B2
(45) Date of Patent: Mar. 19, 2024

(54) BORON NITRIDE FOR MASK PATTERNING

(71) Applicant: Applied Materials, Inc., Santa Clara, CA (US)

(72) Inventors: Siyu Zhu, San Jose, CA (US); Chuanxi Yang, Los Altos, CA (US); Hang Yu, San Jose, CA (US); Deenesh Padhi, Sunnyvale, CA (US); Yeonju Kwak, Sunnyvale, CA (US); Jeong Hwan Kim, San Jose, CA (US); Qian Fu, Pleasanton, CA (US); Xiawan Yang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 359 days.

(21) Appl. No.: 17/330,013

(22) Filed: May 25, 2021

(65) Prior Publication Data

US 2022/0384189 A1    Dec. 1, 2022

(51) Int. Cl.
*H01L 21/033* (2006.01)
*C23C 16/04* (2006.01)
(Continued)

(52) U.S. Cl.
CPC ........ *H01L 21/0337* (2013.01); *C23C 16/042* (2013.01); *C23C 16/342* (2013.01);
(Continued)

(58) Field of Classification Search
CPC ............. H01L 21/0337; H01L 21/0332; H01L 21/31144; H01L 21/02172;
(Continued)

(56) References Cited

U.S. PATENT DOCUMENTS

2002/0090835 A1    7/2002   Chakravarti et al.
2009/0017640 A1    1/2009   Huh et al.
(Continued)

FOREIGN PATENT DOCUMENTS

WO    2021-030310 A1    2/2021

OTHER PUBLICATIONS

International Search Report and Written Opinion dated Sep. 8, 2022 in International Patent Application No. PCT/US2022/030702, 10 pages.

*Primary Examiner* — Mohammad A Rahman
(74) *Attorney, Agent, or Firm* — Kilpatrick Townsend & Stockton LLP

(57) ABSTRACT

Exemplary deposition methods may include delivering a boron-containing precursor and a nitrogen-containing precursor to a processing region of a semiconductor processing chamber. The methods may include providing a hydrogen-containing precursor with the boron-containing precursor and the nitrogen-containing precursor. A flow rate ratio of the hydrogen-containing precursor to either of the boron-containing precursor or the nitrogen-containing precursor may be greater than or about 2:1. The methods may include forming a plasma of all precursors within the processing region of the semiconductor processing chamber. The methods may include depositing a boron-and-nitrogen material on a substrate disposed within the processing region of the semiconductor processing chamber.

20 Claims, 3 Drawing Sheets

(51) Int. Cl.
*C23C 16/34* (2006.01)
*C23C 16/458* (2006.01)
*C23C 16/50* (2006.01)
*H01J 37/32* (2006.01)
*H01L 21/311* (2006.01)

(52) U.S. Cl.
CPC .......... *C23C 16/4584* (2013.01); *C23C 16/50* (2013.01); *H01J 37/32449* (2013.01); *H01L 21/0332* (2013.01); *H01L 21/31144* (2013.01); *H01J 2237/332* (2013.01)

(58) Field of Classification Search
CPC ......... H01L 21/02205; H01L 21/02274; H01L 21/02; H01L 21/033; C23C 16/042; C23C 16/342; C23C 16/4584; C23C 16/50; C23C 16/505; C23C 16/34; H01J 37/32449; H01J 2237/332
See application file for complete search history.

(56) References Cited

U.S. PATENT DOCUMENTS

| | | | |
|---|---|---|---|
| 2011/0244694 A1 | 10/2011 | Antonelli et al. | |
| 2013/0330932 A1 | 12/2013 | Rangarajan et al. | |
| 2015/0147520 A1* | 5/2015 | Grau | B32B 19/04 428/118 |
| 2019/0333760 A1* | 10/2019 | Kalutarage | C23C 16/56 |
| 2019/0385844 A1* | 12/2019 | Vats | H01L 21/02219 |
| 2021/0140045 A1* | 5/2021 | Yang | C23C 16/56 |

* cited by examiner

BORON NITRIDE FOR MASK PATTERNING

TECHNICAL FIELD

The present technology relates to semiconductor deposition processes. More specifically, the present technology relates to methods of depositing materials for improved patterning.

BACKGROUND

Integrated circuits are made possible by processes which produce intricately patterned material layers on substrate surfaces. Producing patterned material on a substrate requires controlled methods of formation and removal of exposed material. As device sizes continue to shrink, material uniformity may affect subsequent operations. Additionally, as more materials may be incorporated on a substrate at any time, improved masks and patterning materials may improve selective removal operations.

Thus, there is a need for improved systems and methods that can be used to produce high quality devices and structures. These and other needs are addressed by the present technology.

SUMMARY

Exemplary deposition methods may include delivering a boron-containing precursor and a nitrogen-containing precursor to a processing region of a semiconductor processing chamber. The methods may include providing a hydrogen-containing precursor with the boron-containing precursor and the nitrogen-containing precursor. A flow rate ratio of the hydrogen-containing precursor to either of the boron-containing precursor or the nitrogen-containing precursor may be greater than or about 2:1. The methods may include forming a plasma of all precursors within the processing region of the semiconductor processing chamber. The methods may include depositing a boron-and-nitrogen material on a substrate disposed within the processing region of the semiconductor processing chamber.

In some embodiments, the boron-and-nitrogen material may be characterized by a film density of greater than or about 1.6 g/cm$^3$. A plasma power may be maintained at less than or about 1000 W during the forming the plasma of all precursors within the processing region of a semiconductor processing chamber. A substrate temperature may be maintained above or about 300° C. during the depositing the boron-and-nitrogen material on the substrate. A pressure may be maintained below or about 10 Torr during the depositing the boron-and-nitrogen material on the substrate. The methods may include providing an argon precursor with the boron-containing precursor and the nitrogen-containing precursor. The as-deposited boron-and-nitrogen material may be characterized by an absolute film stress of less than or about 500 MPa. The boron-containing precursor may be or include diborane, and the nitrogen-containing precursor may be or include ammonia. The substrate may be or include a carbon-containing film formed overlying a stack of alternating films.

Some embodiments of the present technology may encompass deposition method. The methods may include delivering a boron-containing precursor and a nitrogen-containing precursor to a processing region of a semiconductor processing chamber. The methods may include forming a plasma of all precursors within the processing region of the semiconductor processing chamber. The methods may include depositing a boron-and-nitrogen material on a substrate including a carbon-containing material. The substrate may be disposed within the processing region of the semiconductor processing chamber. The boron-and-nitrogen material may be a boron-rich material. A density of the boron-and-nitrogen material may be characterized by a film density of greater than or about 1.6 g/cm$^3$.

In some embodiments, the methods may include providing a hydrogen-containing precursor with the boron-containing precursor and the nitrogen-containing precursor. A flow rate ratio of the hydrogen-containing precursor to either of the boron-containing precursor or the nitrogen-containing precursor may be greater than or about 2:1. The methods may include providing an argon precursor with the boron-containing precursor and the nitrogen-containing precursor. A flow rate ratio of the argon precursor to the hydrogen-containing precursor may be greater than or about 1:1. The as-deposited boron-and-nitrogen material may be characterized by an absolute film stress of less than or about 500 MPa. A substrate temperature may be maintained above or about 300° C. during the depositing the boron-and-nitrogen material on the substrate. A plasma power may be maintained at less than or about 500 W during the forming the plasma of all precursors within the processing region of a semiconductor processing chamber. The boron-containing precursor may be or include diborane, and the nitrogen-containing precursor may be or include ammonia.

Some embodiments of the present technology may encompass deposition methods. The methods may include delivering a boron-containing precursor and a nitrogen-containing precursor to a processing region of a semiconductor processing chamber. The methods may include forming a plasma of all precursors within the processing region of the semiconductor processing chamber. The methods may include depositing a boron-and-nitrogen material on a substrate disposed within the processing region of the semiconductor processing chamber. The substrate may be or include a carbon-containing film formed overlying a stack of alternating films. The boron-and-nitrogen material may be deposited in contact with the carbon-containing film.

In some embodiments, the methods may include providing a hydrogen-containing precursor with the boron-containing precursor and the nitrogen-containing precursor. A flow rate ratio of the hydrogen-containing precursor to either of the boron-containing precursor or the nitrogen-containing precursor may be greater than or about 2:1. The as-deposited boron-and-nitrogen material may be characterized by an absolute film stress of less than or about 500 MPa. A density of the boron-and-nitrogen material may be characterized by a film density of greater than or about 1.6 g/cm$^3$. A substrate temperature may be maintained above or about 400° C. during the depositing the boron-and-nitrogen material on the substrate. A plasma power may be maintained at less than or about 500 W during the forming the plasma of all precursors within the processing region of a semiconductor processing chamber.

Such technology may provide numerous benefits over conventional systems and techniques. For example, the processes may produce films characterized by improved material properties. Additionally, by utilizing silicon-free materials in some embodiments, improved etching may be afforded through underlying films, which may produce more uniform mask opening or other etching compared to conventional technologies. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
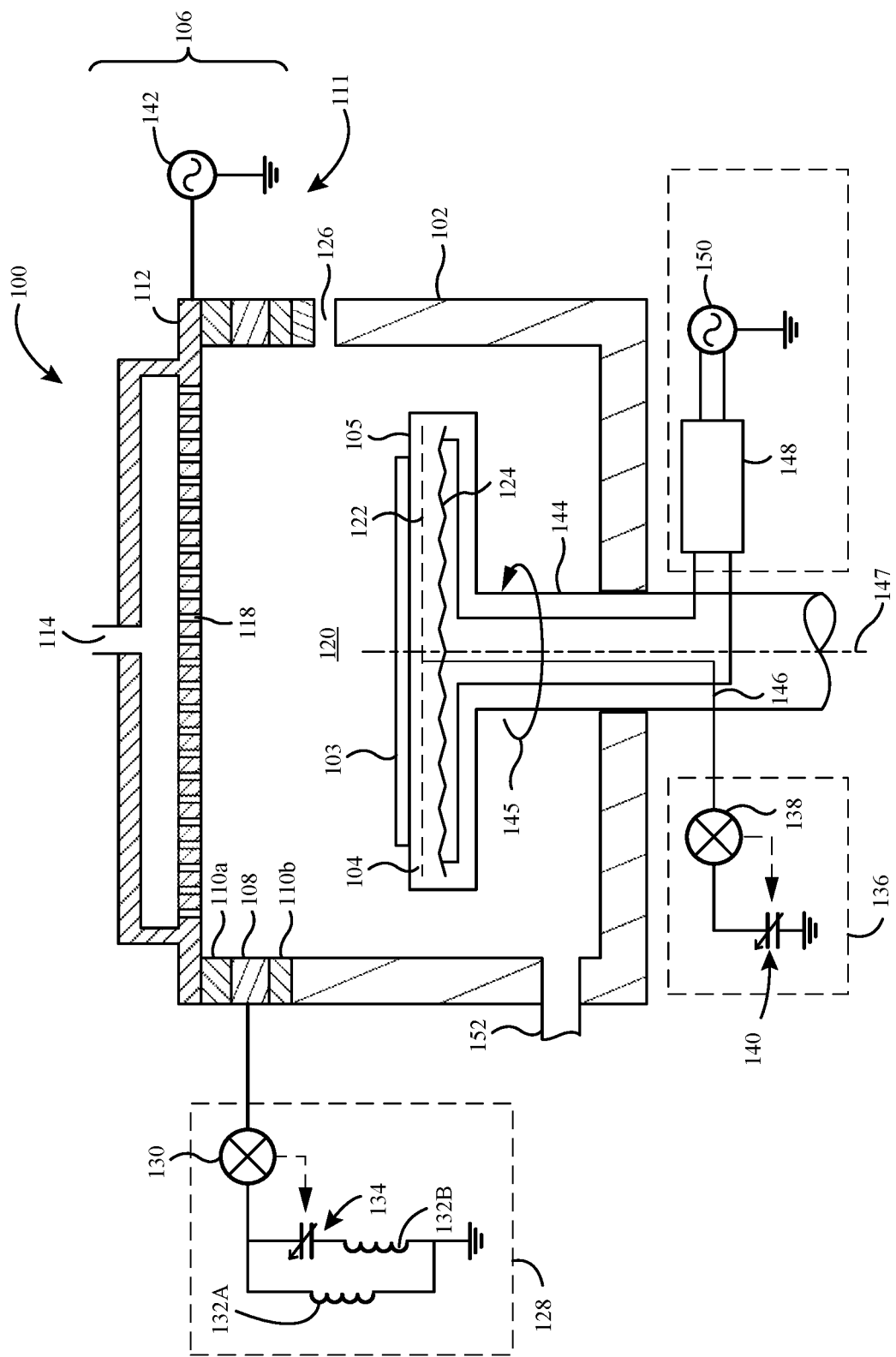
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As 3D NAND structures grow in the number of cells being formed, the aspect ratios of memory holes and other structures continues to increase, sometimes dramatically. During 3D NAND processing, stacks of placeholder layers and dielectric materials may form the inter-electrode dielectric layers. These placeholder layers may have a variety of operations performed to place structures before fully removing the material and replacing it with metal. Some processes in particular, such as memory hole formation or staircase formation, may include etching through the majority or all layers of the stack. Mask materials may be used to allow materials to be partially etched, or etched to produce features across the substrate. Utilizing a mask to etch through dozens or hundreds of layers may be challenging for current mask technology.

For example, in structural formation through memory stacks, some technology may utilize a carbon-containing hardmask, such as amorphous carbon. Prior to patterning the memory structure, a mask-open operation may include forming features through the carbon-containing hardmask. Conventional technologies may utilize silicon-containing materials to pattern the carbon hardmask. However, as the stack of layers increases, the carbon hardmask may increase in thickness as well, such as to a thickness of greater than or about 3 µm, greater than or about 4 µm, or more. This may challenge patterning with conventional technologies. For example, during the mask-open process, silicon-containing masks used to pattern the carbon hardmask may be exposed to etchant chemistries for longer periods of time. This may cause tapered opening of the hardmask, which may expose the silicon-containing material to etchant exposure at greater incident angles.

Compared to other mask materials, silicon-containing materials may be more prone to sputter as incident angle increases. However, this sputtered material may not be exhausted from the structure, and sputtered silicon or silicon-and-oxygen material may redeposit at the etch front through the carbon mask being opened. As this occurs, clogging may occur at the etch front, which may alter feature geometry. For example, memory hole openings in the carbon hardmask may begin to form in an elliptical shape as buildup occurs in some regions. This shape adjustment may cause necking to occur where a diameter through the hardmask may be constricted, and which may fail to form sufficient memory hole patterns in the hardmask. Some conventional technologies may attempt to include a separate etchant or etch operation to dislodge or remove the re-deposited silicon material, but as feature sizes reduce in critical dimension, pattern collapse can occur. Accordingly, as hardmasks increase in thickness, conventional technologies may be incapable of facilitating formation at future nodes.

The present technology may overcome these limitations by utilizing a boron-and-nitrogen material to pattern carbon hardmasks, and in some embodiments the present technology may utilize masks that are free of silicon incorporation. For example, the present technology may form a mask characterized by specific film characteristics that may enable improved carbon hardmask opening by limiting re-deposition and maintaining feature geometries. This may facilitate a more uniform opening profile, which may reduce or limit incorrect pattern transfer to the underlying substrate materials. After describing general aspects of a chamber according to embodiments of the present technology in which plasma processing operations discussed below may be performed, specific methodology and configurations may be discussed. It is to be understood that the present technology is not intended to be limited to the specific films and processing discussed, as the techniques described may be used to improve a number of film formation processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
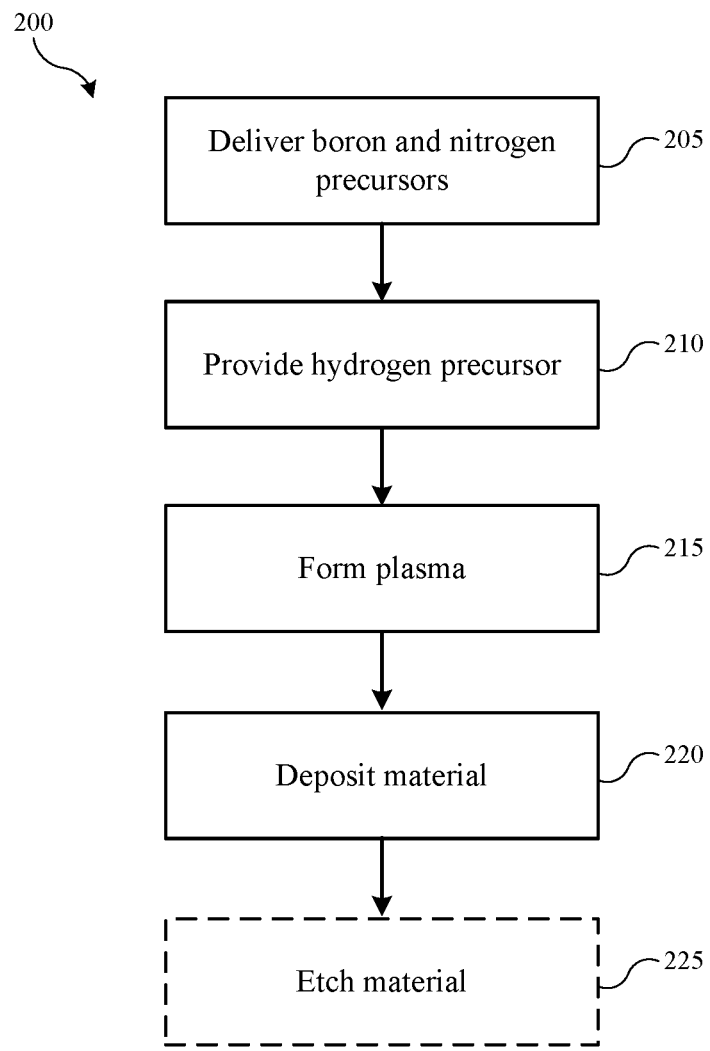
FIG. 2 shows exemplary operations in a deposition method according to some embodiments of the present technology.

FIG. 2 shows exemplary operations in a deposition method 200 according to some embodiments of the present technology. The method may be performed in a variety of processing chambers, including processing chamber 100 described above. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may describe operations to produce materials shown schematically in FIG. 3, the illustration of which will be described in conjunction with the operations of method 200. It is to be understood that the figure illustrates only a partial schematic view, and a substrate may contain any number of additional materials and features having a variety of characteristics and aspects as illustrated in the figures.

Figure 3:
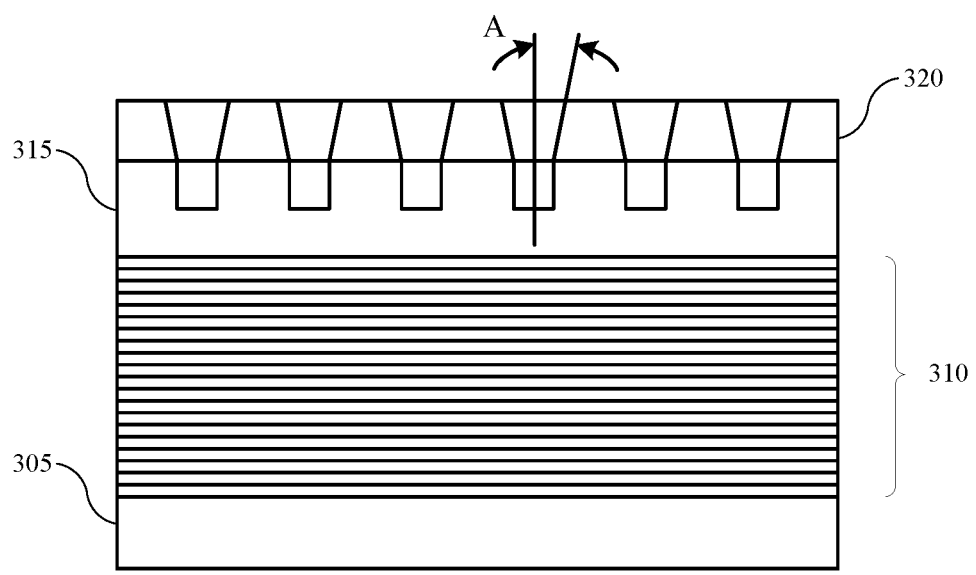
FIG. 3 shows a schematic cross-sectional view of a substrate with materials according to some embodiments of the present technology.

Method 200 may include additional operations prior to initiation of the listed operations. For example, additional processing operations may include forming structures on a semiconductor substrate, including stacks of material for 3D NAND, forming transistor or other memory structures, or any other processing that may include both forming and/or removing material. Prior processing operations may be performed in the chamber in which method 200 may be performed, or processing may be performed in one or more other processing chambers prior to delivering the substrate into the semiconductor processing chamber in which method 200 may be performed. Regardless, method 200 may optionally include delivering a semiconductor substrate to a processing region of a semiconductor processing chamber, such as processing chamber 100 described above, or other chambers that may include components as described above. The substrate may be deposited on a substrate support, which may be a pedestal such as substrate support 104, and which may reside in a processing region of the chamber, such as processing volume 120 described above. An exemplary substrate 305 is illustrated in FIG. 3, on which materials may be formed.

The substrate 305 may be any number of materials on which materials may be deposited. The substrate may be or include silicon, germanium, dielectric materials including silicon oxide or silicon nitride, metal materials, or any number of combinations of these materials, which may be the substrate 305, or materials formed on substrate 305. Overlying the substrate may be a stack 310, which may include alternating layers of silicon and silicon oxide, silicon oxide and silicon nitride, or other materials that may be used in semiconductor processing, such as for producing 3D NAND stacks. Although twenty layers are illustrated, it is to be understood that any number of layers may be included within the overall stack, such as dozens or hundreds of layers.

Overlying the stack of materials may be a hardmask 315, which may be patterned to produce features through the stack. As one non-limiting example, the hardmask may be patterned with a series of apertures, for producing memory holes through the stack 310. Hardmask 315 may be any number of materials used in masking, and in some embodiments may be or include a carbon-containing material. The carbon-containing material may be an amorphous carbon material, as well as a doped-carbon material, which may include one or more metals or elements to adjust properties of the mask. As discussed previously, in some embodiments hardmask 315 may be characterized by a thickness of greater than or about 2 μm, and may be characterized by a thickness of greater than or about 3 μm, greater than or about 4 μm, or more. Consequently, etching through the hardmask may take a greater amount of time, which can lead to excessive widening of features as well as sputtering and re-deposition with conventional technologies. The present technology overcomes these issues by forming a patterning mask on hardmask 315, which may be characterized by improved film characteristics, and may not sputter or re-deposit. In some embodiments, patterning masks according to embodiments of the present technology may be free of silicon, and may not include silicon-containing materials as precursors during formation of the patterning mask. Instead, some embodiments of the present technology may form masks including boron and nitrogen to facilitate patterning hardmask 315, such as an amorphous-carbon hardmask.

At operation 205, one or more precursors may be delivered to the processing region of the chamber. For example, in exemplary embodiments in which a boron-and-nitrogen film may be formed, a boron-containing precursor and a nitrogen-containing precursor may be delivered to the processing region of the processing chamber. Plasma enhanced deposition may be performed in some embodiments of the present technology, which may facilitate material reactions and deposition. As noted above, some embodiments of the present technology may encompass formation or deposition of boron-and-nitrogen materials, which may be characterized by material properties that facilitate patterning of an underlying mask. To produce films characterized by sufficient selectivity to carbon, while also limiting sputtering and pattern loss, the present technology may include a number of other aspects of processing to produce boron nitride films having specific material properties.

Some embodiments of the present technology may include additionally providing a hydrogen-containing precursor at operation 210, which may be provided with the boron-containing precursor and the silicon-containing precursor. The precursors delivered may all be used to form a plasma within the processing region of the semiconductor processing chamber at operation 215. At operation 220, a boron-and-nitrogen-containing material may be deposited on the substrate 305. By incorporating a hydrogen-containing precursor in some embodiments, and/or an argon gas as discussed below, film stress, density, and other film characteristics may be controlled to improve operation as a patterning mask.

By incorporating an additional hydrogen source, a film modification, or profile etch may be performed simultaneously with the deposition of material. For example, through reaction and/or physical interaction with features being formed of the boron-and-nitrogen material, hydrogen radicals may facilitate a controlled film growth and structural formation. Consequently, film stress may be made more neutral, and density can be modulated based on an amount of bombardment, which may also be controlled with additional parameters discussed below. To provide sufficient hydrogen radicals in the process, the hydrogen-containing precursor may be included at a greater flow rate than one or both of the boron-containing precursor and the nitrogen-containing precursor. For example, in some embodiments a flow rate ratio of the hydrogen-containing precursor to either or both of the boron-containing precursor and the nitrogen-containing precursor may be greater than or about 1:1, and in some embodiments may be greater than or about 2:1, greater than or about 3:1, greater than or about 4:1, greater than or about 5:1, greater than or about 6:1, greater than or about 8:1, greater than or about 10:1, greater than or about 15:1, greater than or about 20:1, greater than or about 25:1, greater than or about 30:1, greater than or about 35:1, greater than or about 40:1, greater than or about 45:1, greater than or about 50:1, greater than or about 100:1, greater than or about 200:1, or more.

For example, depending on the precursors used, a nitrogen-containing precursor may be delivered at a flow rate less than or about 500 sccm, and may be delivered at a flow rate less than or about 400 sccm, less than or about 300 sccm, less than or about 200 sccm, less than or about 100 sccm, less than or about 90 sccm, less than or about 80 sccm, less than or about 70 sccm, less than or about 60 sccm, less than or about 50 sccm, less than or about 25 sccm, less than or about 10 sccm, or less. Similarly, a boron-containing precursor may be delivered at a flow rate less than or about 500 sccm, and may be delivered at a flow rate of less than or about 400 sccm, less than or about 350 sccm, less than or about 300 sccm, less than or about 250 sccm, less than or about 200 sccm, less than or about 150 sccm, less than or about 100 sccm, less than or about 80 sccm, less than or about 60 sccm, less than or about 50 sccm, less than or about 40 sccm, less than or about 30 sccm, less than or about 20 sccm, less than or about 10 sccm, or less. In some embodiments, the boron-containing precursor may be diluted in another precursor such as hydrogen, which may limit decomposition. The boron-containing precursor may be included at any percentage of the material, and flow rates noted above may be the mixed precursor flow rate or the flow rate of the boron constituent according to embodiments of the present technology. Any additional ranges within these ranges or as combinations of any stated or unstated number may also be used. The film may be deposited to any thickness on the substrate or materials overlying the substrate. For example, as illustrated in FIG. 3, patterning mask 320, which may be the boron-and-nitrogen film, may be deposited directly overlying and in contact with the hardmask 315, such as the carbon hardmask.

Any number of precursors may be used with the present technology with regard to the boron-containing precursor and the nitrogen-containing precursor. For example, the boron-containing material may be or include boranes, such as borane, diborane, or other multicenter-bonded boron materials, as well as any other boron-containing materials that may be used to produce boron-and-nitrogen-containing materials. The nitrogen-containing material may include any nitrogen materials, such as diatomic nitrogen, ammonia, nitrous oxide, nitric oxide, or any other nitrogen-containing material. In some embodiments one or more dopants may be included in the boron-and-nitrogen film, such as carbon, oxygen, a metal, or any other materials, although in some embodiments the patterning mask 320 may not include or may be free of silicon. The produced film may be characterized by any percentage of incorporation of boron and/or nitrogen in embodiments of the present technology, with either element constituting a majority atomic percentage within the film produced.

For example, the boron incorporation in the boron-and-nitrogen film may be based on any percentage incorporation. As examples, the produced film may include greater than or about 5 at. % boron incorporation, and in some embodiments may include greater than or about 10 at. % boron incorporation, greater than or about 15 at. % boron incorporation, greater than or about 20 at. % boron incorporation, greater than or about 25 at. % boron incorporation, greater than or about 30 at. % boron incorporation, greater than or about 35 at. % boron incorporation, greater than or about 40 at. % boron incorporation, greater than or about 45 at. % boron incorporation, greater than or about 50 at. % boron incorporation, greater than or about 55 at. % boron incorporation, greater than or about 60 at. % boron incorporation, greater than or about 65 at. % boron incorporation, greater than or about 70 at. % boron incorporation, greater than or about 75 at. % boron incorporation, greater than or about 80 at. % boron incorporation, greater than or about 85 at. % boron incorporation, greater than or about 90 at. % boron incorporation, greater than or about 95 at. % boron incorporation, or greater, which may produce a substantially amorphous boron film. In any of these examples the remaining percentage may be essentially or may include nitrogen or hydrogen in any ratio, and additional dopant or constituent materials may also be included. In some embodiments the boron-and-nitrogen film may be a majority boron or a boron-rich film. This may include a film in which boron constitutes greater than or about 51 at. %, as well as a film in which boron constitutes a greater percentage inclusion in relation to one or all other constituent materials.

One or more additional aspects of the deposition may also be tuned to improve aspects of the deposition being performed. For example, the plasma power may impact the extent of hydrogen dissociation, depending on the hydrogen-containing precursor utilized. For some boron-containing materials and nitrogen-containing materials, the materials are sufficiently reactive at deposition temperatures that minimal plasma enhancement may be included. Additionally, plasma power may impact ion bombardment and create more compressive films. Accordingly, in some embodiments plasma power may be maintained at less than or about 1000 W, and may be maintained at less than or about 950 W, less than or about 900 W, less than or about 850 W, less than or about 800 W, less than or about 750 W, less than or about 700 W, less than or about 650 W, less than or about 600 W, less than or about 550 W, less than or about 500 W, less than or about 450 W, less than or about 400 W, less than or about 350 W, less than or about 300 W, less than or about 250 W, less than or about 200 W, or less during plasma formation.

The temperatures of the substrate may additionally impact the deposition. For example, in some embodiments the substrate may be maintained at a temperature of greater than or about 300° C., and may be maintained at a temperature of greater than or about 320° C., greater than or about 340° C., greater than or about 360° C., greater than or about 380° C., greater than or about 400° C., greater than or about 420° C., greater than or about 440° C., greater than or about 460° C., greater than or about 480° C., greater than or about 500° C., greater than or about 520° C., greater than or about 540° C., greater than or about 560° C., greater than or about 580° C., greater than or about 600° C., or greater. Many plasma-enhanced deposition processes and thermal deposition processes may seek to increase deposition temperatures, which may improve bonding within the film more readily. However, as temperature continues to increase, film stress may increase as well, and thus, to produce lower stress within the film, the temperature may be maintained at less than or about 650° C., and may be maintained at less than or about 600° C., or less.

The pressure within the processing region may affect the amount of ionization and physical interaction performed during the deposition. By lowering a processing pressure, increased ion interaction may occur. Accordingly, in some embodiments a processing pressure during the deposition may be maintained at less than or about 10 Torr, and may be maintained at less than or about 9 Torr, less than or about 8 Torr, less than or about 7 Torr, less than or about 6 Torr, less than or about 5 Torr, less than or about 4 Torr, less than or about 3 Torr, less than or about 2 Torr, or less, although in some embodiments pressure may be maintained above or about 1 Torr, above or about 2 Torr, or higher, to control bombardment and film stress. Similarly, substrate spacing from a faceplate or electrode may also impact bombardment, where a lower spacing may increase bombardment. Accordingly, in some embodiments, the substrate may be spaced at a distance from the faceplate of greater than or about 7 mm, and may be spaced at a distance of greater than or about 8 mm, greater than or about 9 mm, greater than or about 10 mm, greater than or about 11 mm, greater than or about 12 mm, greater than or about 13 mm, greater than or about 14 mm, or more.

Argon may be included in some embodiments to further contribute to plasma characteristics and film densifying. Accordingly, in some embodiments argon may be included with the boron-containing precursor and the nitrogen-containing precursor. To limit the effect on bombardment from impact of heavier argon atoms, a flow rate ratio of the argon precursor to the hydrogen-containing precursor may be maintained at less than or about 2:1, and may be maintained at less than or about 1.9:1, less than or about 1.8:1, less than or about 1.7:1, less than or about 1.6:1, less than or about 1.5:1, less than or about 1.4:1, less than or about 1.3:1, less than or about 1.2:1, less than or about 1.1:1, less than or about 1.0:1, or less.

By performing deposition according to embodiments of the present technology, deposited films may be characterized by improved material characteristics. For example, carbon films may be characterized by a substantially neutral stress, while boron-and-nitrogen materials may be characterized by a more compressive stress. If not attenuated, the stress may impact adhesion or bowing of the substrate. Performing deposition operations according to embodiments of the present technology may produce films that may relax a compressive stress. For example, in some embodiments, subsequent the deposition, the compressive stress within the film may be maintained at less than or about −600 MPa, which may be an absolute stress of less than or about 600 MPa, and the compressive stress may be less than or about −550 MPa, less than or about −500 MPa, less than or about −450 MPa, less than or about −400 MPa, less than or about −350 MPa, less than or about −300 MPa, less than or about −250 MPa, less than or about −200 MPa, less than or about −150 MPa, less than or about −100 MPa, or less.

Additionally, the present technology may produce films characterized by an increased density over other boron-containing films. Silicon oxynitride films may be characterized by higher density, and in order to provide a closer substitute, the present technology may produce boron-and-nitrogen films characterized by a film density of greater than or about 1.50 g/cm$^3$, and may produce films characterized by a film density of greater than or about 1.55 g/cm$^3$, greater than or about 1.60 g/cm$^3$, greater than or about 1.65 g/cm$^3$, greater than or about 1.70 g/cm$^3$, greater than or about 1.75 g/cm$^3$, greater than or about 1.80 g/cm$^3$, greater than or about 1.85 g/cm$^3$, greater than or about 1.90 g/cm$^3$, greater than or about 1.95 g/cm$^3$, greater than or about 2.00 g/cm$^3$, or more. This may improve etch selectivity, which may also control an etch profile through the patterning mask.

After film formation has been performed, the patterning mask may be processed to form features to be transferred to an underlying material in an etch process at optional operation 225. In one non-limiting example as illustrated in FIG. 3, the patterning mask 320 may be used to pattern a hardmask 315 for 3D NAND. An etch process may then be performed to open the hardmask prior to etching the film stack. As illustrated in the figure, as the mask-open process is performed, because of increased hardmask thicknesses, the patterning mask 320 may have increased exposure to etchant materials, which may cause excess removal and an amount of sloping along the mask. FIG. 3 illustrates an exaggerated example, although in conventional technologies utilizing silicon-containing materials, this removal may produce sputtering due to the higher incidence angle along the patterning mask as a slope is formed.

The present technology may be characterized by limited or essentially no sputtering that may produce re-deposition or necking within the hardmask 315, and may increase uniformity of aperture or feature formation through the hardmask 315 or an underlying layer. As illustrated, an angle A, which may represent an angle from vertical through the patterning mask and/or the hardmask may be maintained at less than or about 15° in some embodiments, and may produce patterning in features where angle A may be maintained at less than or about 10°, less than or about 9°, less than or about 8°, less than or about 7°, less than or about 6°, less than or about 5°, less than or about 4°, less than or about 3°, less than or about 2°, less than or about 1°, or less, in which parallelism or substantially or essentially vertical walls may be produced entirely through the structure. Additionally, where apertures are being formed, a diameter about each aperture may be uniform throughout the hardmask after etching by greater than or about 90%, and may be consistent or uniform from top to bottom at any two points by greater than or about 91%, greater than or about 92%, greater than or about 93%, greater than or about 94%, greater than or about 95%, greater than or about 96%, greater than or about 97%, greater than or about 98%, greater than or about 99%, or more. By performing deposition according to embodiments of the present technology, improved hardmasks may be formed, which may facilitate increased uniformity during processing by improving etch selectivity while utilizing materials that may reduce sputtering or re-deposition that may cause non-uniform etching.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A deposition method comprising:
    delivering a boron-containing precursor and a nitrogen-containing precursor to a processing region of a semiconductor processing chamber;
    providing a hydrogen-containing precursor with the boron-containing precursor and the nitrogen-containing precursor, wherein a flow rate ratio of the hydrogen-containing precursor to either of the boron-containing precursor or the nitrogen-containing precursor is greater than or about 2:1;
    forming a plasma of all precursors within the processing region of the semiconductor processing chamber; and
    depositing a boron-and-nitrogen material that is free of silicon on a substrate disposed within the processing region of the semiconductor processing chamber.

2. The deposition method of claim 1, wherein the boron-and-nitrogen material is characterized by a film density of greater than or about 1.6 g/cm$^3$.

3. The deposition method of claim 1, wherein a plasma power is maintained at less than or about 1000 W during the forming the plasma of all precursors within the processing region of the semiconductor processing chamber.

4. The deposition method of claim 1, wherein a substrate temperature is maintained above or about 300° C. during the depositing the boron-and-nitrogen material on the substrate.

5. The deposition method of claim 1, wherein a pressure is maintained below or about 10 Torr during the depositing the boron-and-nitrogen material on the substrate.

6. The deposition method of claim 1, further comprising:
    providing an argon precursor with the boron-containing precursor and the nitrogen-containing precursor.

7. The deposition method of claim 1, wherein the as-deposited boron-and-nitrogen material is characterized by an absolute film stress of less than or about 500 MPa.

8. The deposition method of claim 1, wherein the boron-containing precursor comprises diborane, and wherein the nitrogen-containing precursor comprises ammonia.

9. The deposition method of claim 1, wherein the substrate comprises a carbon-containing film formed overlying a stack of alternating films.

10. A deposition method comprising:
    delivering a boron-containing precursor and a nitrogen-containing precursor to a processing region of a semiconductor processing chamber;
    forming a plasma of all precursors within the processing region of the semiconductor processing chamber; and
    depositing a boron-and-nitrogen material on a substrate comprising a carbon-containing material, wherein the substrate is disposed within the processing region of the semiconductor processing chamber, wherein the boron-and-nitrogen material comprises a boron-rich material, and wherein a density of the boron-and-nitrogen material is characterized by a film density of greater than or about 1.6 g/cm$^3$.

11. The deposition method of claim 10, further comprising:
    providing a hydrogen-containing precursor with the boron-containing precursor and the nitrogen-containing precursor, wherein a flow rate ratio of the hydrogen-containing precursor to either of the boron-containing precursor or the nitrogen-containing precursor is greater than or about 2:1.

12. The deposition method of claim 11, further comprising:
    providing an argon precursor with the boron-containing precursor and the nitrogen-containing precursor, wherein a flow rate ratio of the argon precursor to the hydrogen-containing precursor is greater than or about 1:1.

13. The deposition method of claim 10, wherein the as-deposited boron-and-nitrogen material is characterized by an absolute film stress of less than or about 500 MPa.

14. The deposition method of claim 10, wherein a substrate temperature is maintained above or about 300° C. during the depositing the boron-and-nitrogen material on the substrate.

15. The deposition method of claim 10, wherein a plasma power is maintained at less than or about 500 W during the forming the plasma of all precursors within the processing region of the semiconductor processing chamber.

16. The deposition method of claim 10, wherein the boron-containing precursor comprises diborane, and wherein the nitrogen-containing precursor comprises ammonia.

17. A deposition method comprising:
    delivering a boron-containing precursor and a nitrogen-containing precursor to a processing region of a semiconductor processing chamber;
    forming a plasma of all precursors within the processing region of the semiconductor processing chamber, wherein a plasma power is maintained at less than or about 500 W during the forming the plasma of all precursors within the processing region of the semiconductor processing chamber; and depositing a boron-and-nitrogen material on a substrate disposed within the processing region of the semiconductor processing chamber, wherein the substrate comprises a carbon-containing film formed overlying a stack of alternating films, and wherein the boron-and-nitrogen material is deposited in contact with the carbon-containing film.

18. The deposition method of claim 17, further comprising:

providing a hydrogen-containing precursor with the boron-containing precursor and the nitrogen-containing precursor, wherein a flow rate ratio of the hydrogen-containing precursor to either of the boron-containing precursor or the nitrogen-containing precursor is greater than or about 2:1.

19. The deposition method of claim 17, wherein the as-deposited boron-and-nitrogen material is characterized by an absolute film stress of less than or about 500 MPa, and wherein a density of the boron-and-nitrogen material is characterized by a film density of greater than or about 1.6 g/cm$^3$.

20. The deposition method of claim 17, wherein a substrate temperature is maintained above or about 400° C. during the depositing the boron-and-nitrogen material on the substrate.

\* \* \* \* \*